US009425177B2

(12) United States Patent
Koyanagi et al.

(10) Patent No.: US 9,425,177 B2
(45) Date of Patent: Aug. 23, 2016

(54) METHOD OF MANUFACTURING SEMICONDUCTOR DEVICE INCLUDING GRINDING SEMICONDUCTOR WAFER (71) Applicant: Micron Technology, Inc., Boise, ID (US)

(72) Inventors: Tadashi Koyanagi, Tokyo (JP); Youkou Ito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/310,862

(22) Filed: Jun. 20, 2014

(65) Prior Publication Data

US 2014/0377886 A1 Dec. 25, 2014

(30) Foreign Application Priority Data

Jun. 25, 2013 (JP) .................................. 2013-132704

(51) Int. Cl.
*H01L 21/00* (2006.01)
*H01L 25/00* (2006.01)
(Continued)

(52) U.S. Cl.
CPC ............. *H01L 25/50* (2013.01); *H01L 21/561* (2013.01); *H01L 21/565* (2013.01); *H01L 21/566* (2013.01); *H01L 21/6836* (2013.01); *H01L 21/78* (2013.01); *H01L 22/20* (2013.01); *H01L 23/3135* (2013.01); *H01L 24/94* (2013.01); *H01L 24/97* (2013.01); *H01L 25/0657* (2013.01); *H01L 22/14* (2013.01); *H01L 23/544* (2013.01); *H01L 24/11* (2013.01); *H01L 24/13* (2013.01); *H01L 24/14* (2013.01); *H01L 24/16* (2013.01); *H01L 25/18* (2013.01); *H01L 2221/6834* (2013.01); *H01L 2221/68327* (2013.01); *H01L 2223/54433* (2013.01); *H01L 2223/54453* (2013.01); *H01L 2224/0401* (2013.01); *H01L 2224/1134* (2013.01); *H01L 2224/13025* (2013.01); *H01L 2224/13111* (2013.01); *H01L 2224/13144* (2013.01); *H01L 2224/13147* (2013.01); *H01L 2224/14181* (2013.01); *H01L 2224/16145* (2013.01); *H01L 2224/16225* (2013.01); *H01L 2224/32145* (2013.01); *H01L 2224/32225* (2013.01); *H01L 2224/73* (2013.01); *H01L 2224/73104* (2013.01); *H01L 2224/73204* (2013.01); *H01L 2224/75* (2013.01); *H01L 2224/75621* (2013.01);
(Continued)

(58) Field of Classification Search
USPC ............ 438/106, 5, 107, 108, 109, 110, 111, 438/112, 113, 114, 127
See application file for complete search history.

(56) References Cited

U.S. PATENT DOCUMENTS

2003/0017647 A1* 1/2003 Kwon et al. ................. 438/109
2013/0183799 A1* 7/2013 Sasaki et al. ................ 438/118

FOREIGN PATENT DOCUMENTS

JP 2012209449 A 10/2012

*Primary Examiner* — Timor Karimy
(74) *Attorney, Agent, or Firm* — Perkins Coie LLP (57) ABSTRACT

A method of manufacturing a semiconductor device according to one embodiment includes: preparing a semiconductor wafer which is partitioned into a plurality of first semiconductor chips, the plurality of first semiconductor chips including a first group of first semiconductor chips and a second group of first semiconductor chips; providing a second semiconductor chip over at least one of first semiconductor chips of the first group; providing a sealer on the first semiconductor chips of the second group; and grinding one face of the semiconductor wafer which is on the opposite side from a face on which the second semiconductor chip and the sealer are provided.

28 Claims, 9 Drawing Sheets

(51) Int. Cl.
   *H01L 21/66*    (2006.01)
   *H01L 21/78*    (2006.01)
   *H01L 23/31*    (2006.01)
   *H01L 21/56*    (2006.01)
   *H01L 21/683*   (2006.01)
   *H01L 25/065*   (2006.01)
   H01L 23/544     (2006.01)
   H01L 23/00      (2006.01)
   H01L 25/18      (2006.01)

(52) U.S. Cl.
   CPC .. *H01L2224/81* (2013.01); *H01L 2224/81191* (2013.01); *H01L 2224/81192* (2013.01); *H01L 2224/81203* (2013.01); *H01L 2224/81205* (2013.01); *H01L 2224/83* (2013.01); *H01L 2224/83191* (2013.01); *H01L 2224/83192* (2013.01); *H01L 2224/92* (2013.01); *H01L 2224/92143* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06568* (2013.01); *H01L 2924/10253* (2013.01); *H01L 2924/1431* (2013.01); *H01L 2924/1434* (2013.01); *H01L 2924/1436* (2013.01); *H01L 2924/15311* (2013.01); *H01L 2924/181* (2013.01); *H01L 2924/18161* (2013.01); *H01L 2924/3512* (2013.01)

ND OF THE INVENTION

1. Field of the Invention

The present invention relates to a method of manufacturing a semiconductor device including grinding a semiconductor wafer after stacking semiconductor chips on the semiconductor wafer.

2. Description of the Related Art

With miniaturization and sophistication of electronic equipment, chip-on-chip (CoC) semiconductor devices with a plurality of semiconductor chips stacked on top of one another have recently been developed. JP2012-209449A discloses a chip-on-wafer (CoW) method that stacks semiconductor chips as individual pieces on a base wafer to form chip stacks and then separates the base wafer into individual pieces to obtain chip stacks. The chip stacks as individual pieces are mounted on a wiring board.

FIGS. 17 to 28 of JP2012-209449A show a method of manufacturing a semiconductor package. According to the manufacturing method, a semiconductor substrate is first prepared in which a plurality of portions, that serve as IF chips, are arrayed. A plurality of memory chips are then flip-chip mounted on the semiconductor substrate for each of the portions that serve as IF chips. With this operation, chip stacks having a plurality of semiconductor chips stacked on top of one another are formed. A groove is formed in the semiconductor substrate along a dicing line through half-cut dicing using a dicing blade. A support substrate is attached to memory chips at the top layer mounted on the semiconductor substrate via an adhesive layer. One face of the semiconductor substrate which is on the opposite side from a face with the support substrate, i.e., a face on the opposite side from a face with the groove formed through halt-cut dicing is ground (back-ground). At this time, the semiconductor substrate is thinned to reach a bottom of the groove formed through half-cut dicing. With this operation, the semiconductor substrate is divided into chip stacks.

Next, the chip stacks are mounted on a mother wiring board. Solder balls that serve as external terminals are arranged on the mother wiring board. Next, the mother wiring board is cut so that it is divided into individual semiconductor packages.

The present inventor has found shat thinning a semiconductor substrate (semiconductor wafer) through back-grinding after flip-chip mounting a plurality of memory chips on the semiconductor substrate leads to the problem below.

When memory chips are mounted on a plurality of IF chips of a semiconductor substrate, semiconductor chips may be mounted on only some of the IF chips. For example, if there is a defective IF chip, a semiconductor chip will be not mounted on the defective IF chip. In this case, a large void is created at a portion on the semiconductor substrate where a semiconductor chip is not mounted. When one face of the semiconductor substrate is ground through back-grinding in the presence of this void, there is variation in the load on the semiconductor substrate. As a result, a part of a semiconductor chip may be damaged (a chip crack may occur) or there may be variation in the thickness of the semiconductor substrate after grinding. There is thus a need for an improved method of manufacturing a semiconductor device.

SUMMARY

A method of manufacturing a semiconductor device according to one embodiment includes: preparing a semiconductor wafer which is partitioned into a plurality of first semiconductor chips, the plurality of first semiconductor chips including a first group of first semiconductor chips and a second group of first semiconductor chips; providing a second semiconductor chip over at least one of first semiconductor chips of the first group; providing a sealer on the first semiconductor chips of the second group; and grinding one face of the semiconductor wafer which is on the opposite side from a face on which the second semiconductor chip and the sealer are provided.

According to another embodiment, a method of manufacturing a semiconductor device comprises: preparing a semiconductor wafer which is partitioned into a plurality of first semiconductor chips; detecting a defective first semiconductor chip from among the plurality of first semiconductor chips; providing a second semiconductor chip in at least one tier on each of the first semiconductor chips except for the defective first semiconductor chip; providing a sealer on the defective first semiconductor chip; and grinding one face of the semiconductor wafer which is on the opposite side from a face in which the second semiconductor chip and the sealer are provided.

According to still another embodiment, a method comprises: preparing a semiconductor wafer including a first surface, a second surface opposite to the first surface and a plurality of first semiconductor chip regions formed in a side of the first surface; stacking a plurality of second semiconductor chips over the first semiconductor chips of the semiconductor wafer, and each of the second semiconductor chips including an upper surface; providing a sealing layer on the first surface of the semiconductor wafer with a sheet member being in contact with the upper surfaces of the second semiconductor chips; and grinding the second surface of the semiconductor wafer, after providing the sealing layer.

According to the above-described method, a portion on the first semiconductor chip where the second semiconductor chip is not provided, i.e., a void portion, is filled with the sealer. The one face of the semiconductor wafer is ground while the void portion is filled with the sealer, which reduces variation in the load on the semiconductor wafer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1A:
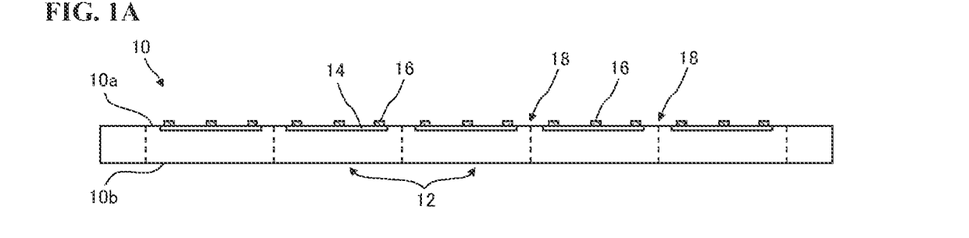
FIGS. 1A to 1E are process views showing, in a stepwise manner, a method of manufacturing a semiconductor device according to a first embodiment.

FIGS. 1A to 1E show, in a stepwise manner, a method of manufacturing a semiconductor device according to a in embodiment. As shown in FIG. 1A, semiconductor wafer 10 in which a plurality of first semiconductor chips 12 are arranged is first prepared. Semiconductor wafer 10 is partitioned into first semiconductor chips 12 by dicing lines 18. Semiconductor wafer 10 has a disc-like substrate which is made of, for example, silicon.

The plurality of first semiconductor chips 12 formed in semiconductor wafer 10 each have a predetermined circuitry layer 14. Most of circuitry layer 14 is covered with an insulating layer (not shown), and a part of circuitry layer 14 that is not covered by the insulating layer is exposed. The exposed part of circuitry layer 14 that is not covered by the insulating layer forms electrode pads. Bump electrode 16 is formed on each electrode pad. Circuitry layer 14 and bump electrodes 16 are provided on one face 10a of first semiconductor chip 12. In the following description, face 10a with circuitry layer 14 and bump electrodes 16 formed thereon of semiconductor wafer 10 will be referred to as an "obverse face" hereinafter. Face 10b on the opposite side from the obverse face of semiconductor wafer 10 will be referred to as a "reverse face." Note that the terms "obverse face" and "reverse face" are used not to restrictively interpret the invention but to distinguish opposite faces of the semiconductor wafer for convenience.

First semiconductor chip 12 may be a memory chip, such as a DRAM. If first semiconductor chip 12 is a memory chip, the memory chip will have a memory circuit as circuitry layer 14.

Second semiconductor chips 22 to be mounted on first semiconductor chips 12 are prepared. Second semiconductor chip 22 has a substrate which is made of, for example, silicon. Predetermined circuitry layer 24 is formed on one face 23 of second semiconductor chip 22. Most of circuitry layer 24 is covered with an insulating layer (not shown), and a part of circuitry layer 24 that is not covered by the insulating layer is exposed. The exposed part of circuitry layer 24 that is not covered by the insulating layer forms electrode pads. Bump electrode 26 is formed on each electrode pad. Circuitry layer 24 and bump electrodes 26 are provided on one face 23 of second semiconductor chip 22. Bump electrodes 27 are provided on other face 25 of second semiconductor chip 22 that is on the opposite side from one face 23. In the following description, one face 23 of second semiconductor chip 22 will be referred to as an "obverse face" while the other face 25 of second semiconductor chip 22 will be referred to as the "reverse face." Note that the terms "obverse face" and "reverse face" are used not to restrictively interpret the invention but to distinguish opposite faces of the semiconductor chip for convenience.

Bump electrodes 27 formed on the reverse face correspond to bump electrodes 26 formed on the obverse face. Each bump electrode 26 on the obverse face is electrically connected to corresponding bump electrode 27 formed on reverse face 25 of second semiconductor chip 22 by piece 28 of through wiring which extends through the substrate.

A solder layer (e.g., a SnAg-plated layer) is preferably formed on the surface of bump electrode 27 formed on the reverse face of second semiconductor chip 22. Non-conductive film (NCF) 29 as a filler is preferably formed over entire reverse face 25 of second semiconductor chip 22. Reverse face 25 of second semiconductor chip 22 may be covered with NCF 29. Second semiconductor chip 22 may be a memory chip, such as a DRAM. The memory chip has a memory circuit as circuitry layer 24.

Defective first semiconductor chip 13 may be detected in advance from among the plurality of first semiconductor chips 12, and a predetermined identification mark may be put in advance on defective first semiconductor chip 13. The detection of defective semiconductor chip 13 may be performed before mounting (to be described later) of second semiconductor chip 22 on first semiconductor chip 12. The detection of defective semiconductor chip 13 can be performed by any means, such as a wafer probe.

Figure 1B:
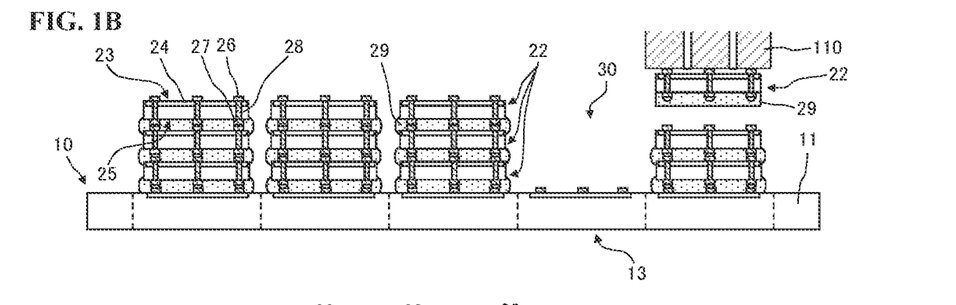

As shown in FIG. 1B, second semiconductor chips 22 are provided on some of the plurality of first semiconductor chips 12. In this embodiment, second semiconductor chips 22 are provided on first semiconductor chips 12 except for defective first semiconductor chip 13. At this time, semiconductor wafer 10 is preferably sucked and held on a stage of a flip-chip bonding apparatus (not shown). In order to stably hold semiconductor wafer 10, semiconductor wafer 10 preferably has a sufficient thickness. For example, semiconductor wafer 10 may have a thickness of about 800 μm.

More specifically, second semiconductor chips 22 are flip-chip mounted on first semiconductor chips 12. Bump electrodes 27 on the reverse face formed on each second semiconductor chip 22 are joined to bump electrodes 16 of first semiconductor chip 12. With this operation, bump electrodes 27 formed on the reverse face of second semiconductor chip 22 and bump electrodes 16 of first semiconductor chip 12 are electrically connected to each other. The joining of bump electrodes 16 and 27 can be performed through a thermocompression bonding method that applies a predetermined load on semiconductor chips 12 and 22 by bonding tool 110 which is set at a high temperature while sucking and holding second semiconductor chip 22 on bonding tool 110. At this time, NCF 29 formed on the reverse face of each second semiconductor chip 22 melts and is then hardened. With this operation, a space between first semiconductor chip 12 and second semiconductor chip 22 is filled with NCF 29. An ultrasonic compression bonding method that performs compression bonding while applying ultrasonic waves or an ultrasonic thermocompression bonding method that uses thermocompression bonding and ultrasonic compression bonding in combination can also be used for joining bump electrodes 16 and 27, instead of the thermocompression bonding method.

Another second semiconductor chip 22 is mounted on each second semiconductor chip 22 through the same method as described above. In this manner, second semiconductor chips 22 in three tiers are mounted on semiconductor wafer 10 (see FIG. 1B). Bump electrodes 27 provided on a face facing first semiconductor chip 12 of each second semiconductor chip 22 in the bottom tier are electrical connected to corresponding bump electrodes 16 of first semiconductor chip 12. Second semiconductor chips 22 adjacent to each other are electrically connected via bump electrodes 26 and 27. Note that the gap between second semiconductor chips 22 is filled with NCF 29 formed on the reverse face of second semiconductor chip 22.

Second semiconductor chip 22 is not provided on defective first semiconductor chip 13. Thus, large void 30 is created on defective first semiconductor chip 13.

Figure 1C:
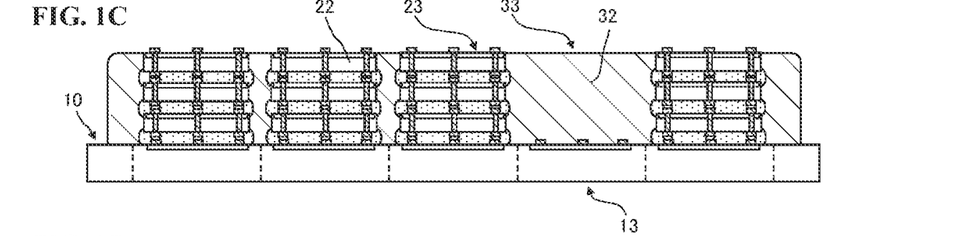

As shown in FIG. 1C, sealer 32 is provided on defective first semiconductor chip 13, and void 30 is filled with sealer 32. Sealer 32 is formed on obverse face 10a side of semiconductor wafer 10. Sealer 32 may be a thermosetting resin.

Figure 2A:
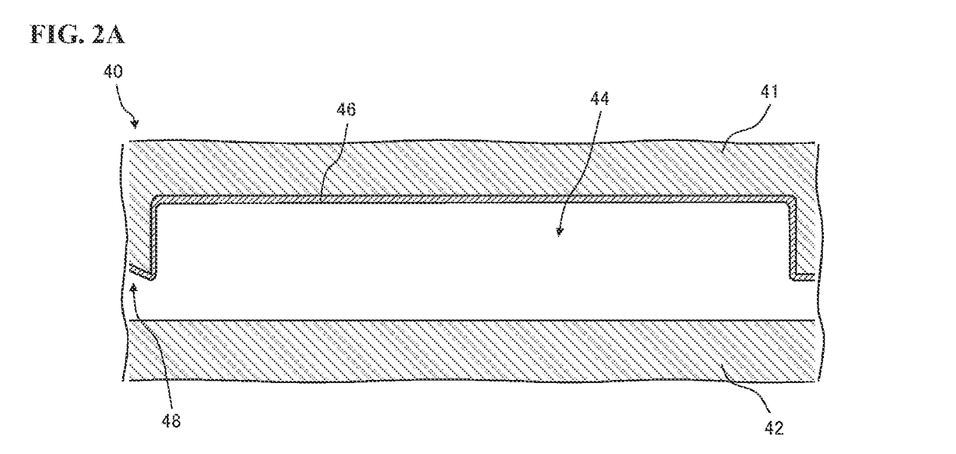
FIGS. 2A to 2C are process views showing, in a stepwise manner, a process of providing a sealer.

FIGS. 2A to 2C snow, in a stepwise manner, a process of providing sealer 32. Molding apparatus 40 has a form die which is composed of male mold 41 and female mold 42, as shown in, for example, FIG. 2A. Cavity 44 in a predetermined shape is formed between male mold 41 and female mold 42. Resilient sheet material 46 is preferably provided on a surface of male mold 41. A pot (not shown) to which a solid resin material (resin tablet) is supplied is formed at female mold 42.

Semiconductor wafer 10 with second semiconductor chips 22 mounted thereon is first set on female mold 42. Semiconductor wafer 10 is subjected to mold clamping with male mold 41 and female mold 42. With this operation, cavity 44 in a predetermined shape and gate portion 48 for introducing sealer 32 into cavity 44 are formed on semiconductor wafer 10.

Obverse face 23 of each second semiconductor chip 22 in the top tier comes into close contact with sheet material 46. Even if there are variations in the height of mounted second semiconductor chips 22 among first semiconductor chips 12, all obverse faces 23 of second semiconductor chips 22 in the top tier can come into close contact with sheet material 46 due to resilience of sheet material 46. Even with fine projections like bump electrodes 26 on obverse face 23 of second semiconductor chip 22, obverse face 23 of second semiconductor chip 22 can come into close contact with sheet material 46 due to the resilience of sheet material 46. In this case, sheet material 46 preferably has a thickness such that bump electrodes 26 on obverse face 23 of second semiconductor chip 22 can be buried in sheet material 46.

Figure 2B:
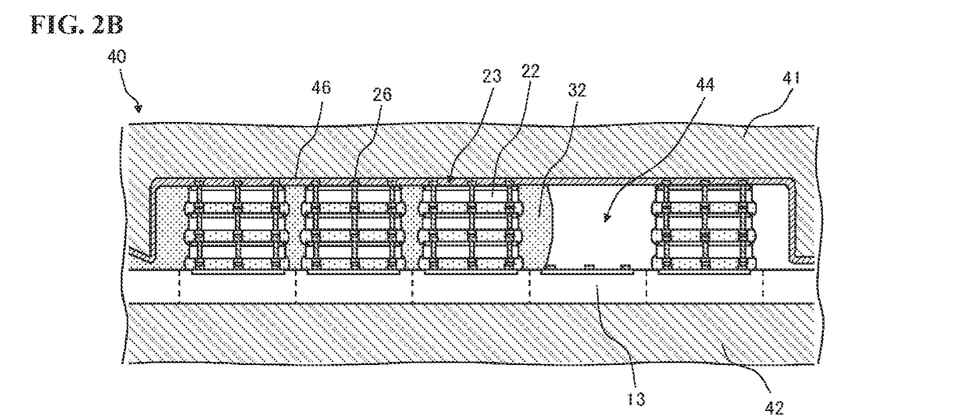
Figure 2C:
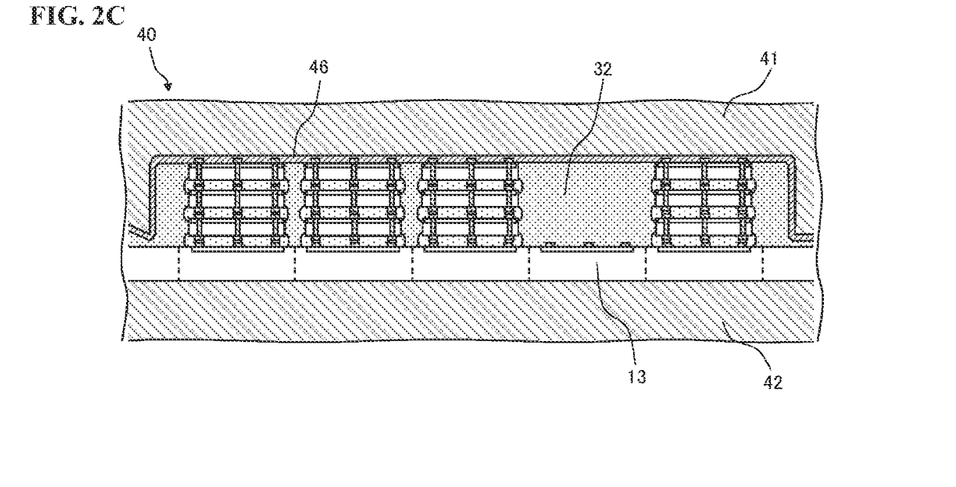

Sealer 32 may be formed by a resin material. The resin material is supplied to the pot of female mold 42, and the resin material is heated and then melts. As shown in FIG. 2B, the melt sealing resin is injected from gate portion 48 into cavity 44 by a plunger (not shown). As shown in FIG. 2C, after cavity 44 is filled with the sealing resin, the sealing resin is cured at a predetermined temperature of, for example, 180° C. With this curing, the sealing resin is hardened. In the above-described manner, sealer 32 is formed on one face of semiconductor wafer 10. Sealer 32 fills void 30 on defective semiconductor chip 13. Next, semiconductor wafer 10 is removed from the mold apparatus. Sealer 32 is completely hardened by being baked at a predetermined temperature (e.g., 180° C.) for a predetermined time.

As shown in FIG. 1C, sealer 32 is preferably filled into the gap between second semiconductor chips 22 that are adjacent to each other, i.e., a gap formed on dicing line 18 and void 30 on defective first semiconductor chip 13 in one operation.

Since sealer 32 is formed while obverse face 23 of each second semiconductor chip 22 in the top tier is in close contact with sheet material 46, obverse face 23 of second semiconductor chip 22 in the top tier is uncovered by sealer 32 and is exposed. Bump electrodes 26 on obverse face 23 of second semiconductor chip 22 in the top tier are also uncovered by sealer 32 and is exposed. In the present embodiment, surface 33 of sealer 32 is substantially coplanar with obverse face 23 of second semiconductor chip 22 in the top tier.

Figure 1D:
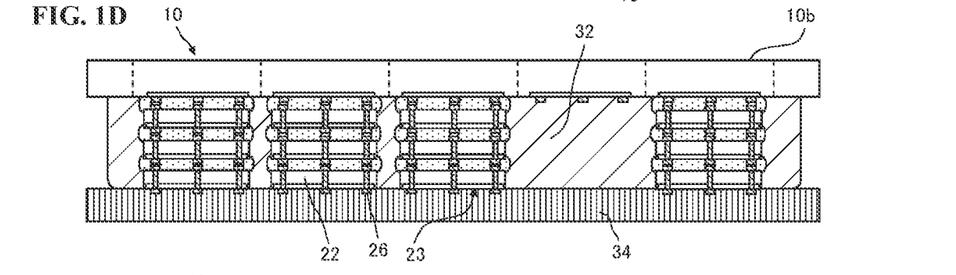

After sealer 32 is formed, protective tape 34 (e.g., a back-grinding tape) is attached to obverse face 23 of each second semiconductor chip 22 in the top tier, as shown in FIG. 1D. Since void 30 on defective semiconductor chip 13 is filled with sealer 32 at this time, there is no large void between protective tape 34 and semiconductor wafer 10. An adhesive layer of protective tape 34 preferably has a thickness such that bump electrodes 26 on obverse face 23 of second semiconductor chip 22 can be buried in the adhesive layer.

Figure 1E:
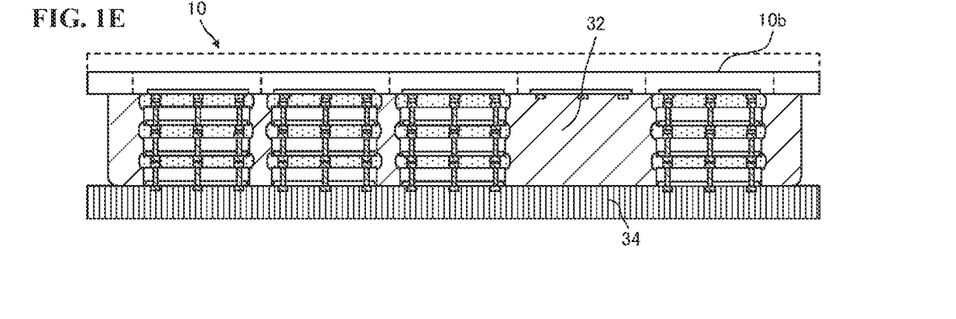
Figure 3A:
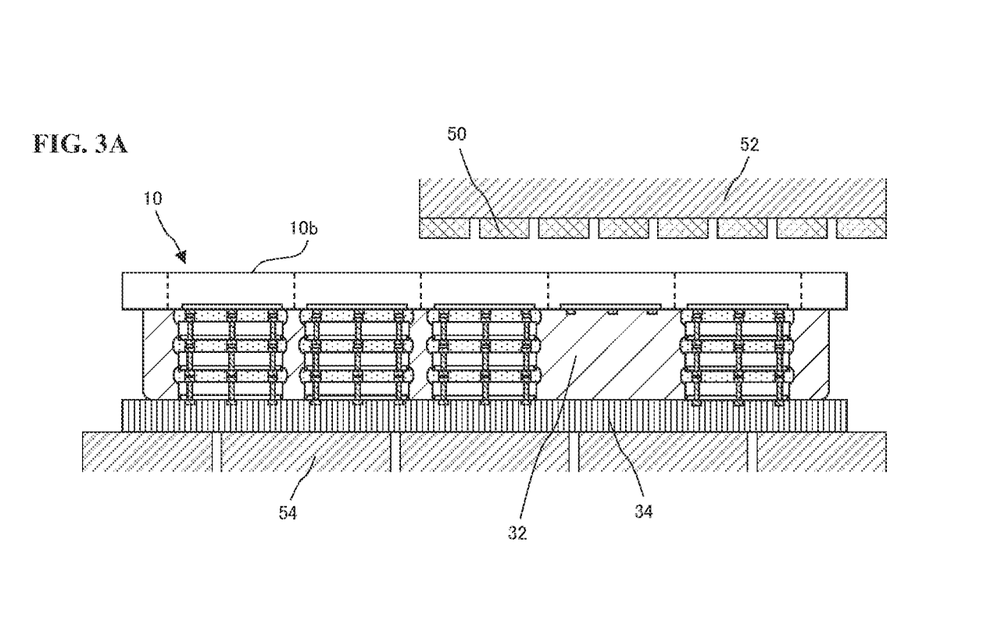
FIGS. 3A and 3B are process views showing, in a stepwise manner, a process of grinding a semiconductor wafer.

As shown in FIG. 1E, reverse face 10b of semiconductor wafer 10 is cut until semiconductor wafer 10 has a predetermined thickness (a back-grinding process). More specifically, as shown in FIG. 3A, protective tape 34 is sucked and held on stage 54 of the back-grinding apparatus. With this operation, reverse face 10b of semiconductor wafer 10, i.e., one face with no bump electrodes 16 formed thereon of each first semiconductor chip 12 is made to face upward. The cutting of semiconductor wafer 10 can be performed using wheel 52 on which a plurality of grindstones 50 have been arranged. Semiconductor wafer 10 is ground by pressing grindstones 50 against reverse face 10b of semiconductor wafer 10 while rotating wheel 52 (see FIG. 3B). In the present embodiment, semiconductor wafer 10 is ground to a predetermined thickness (e.g., about 100 μm). The thinning of semiconductor wafer 10 allows a reduction in the size of a finished semiconductor device.

Figure 3B:
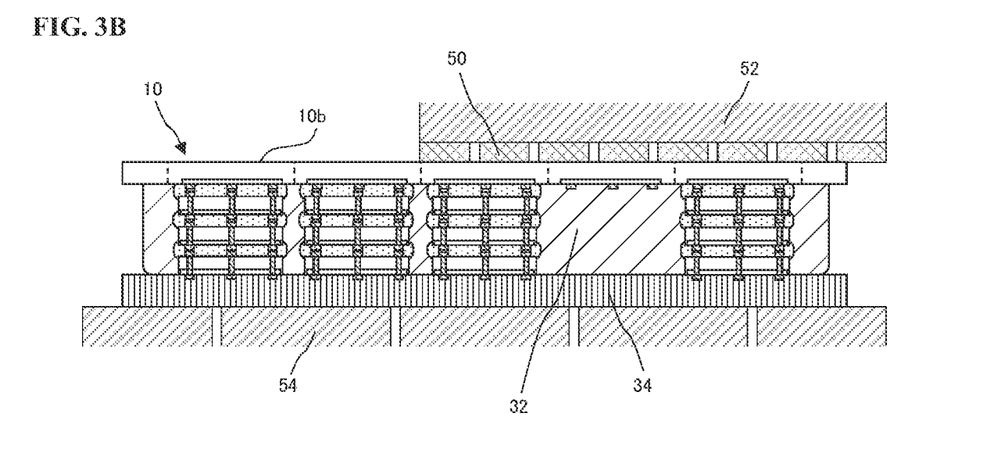

Sealer 32 fills a portion on defective semiconductor chip 13, i.e., void 30. Since reverse face 10b of semiconductor wafer 10 is ground while void 30 is filled, variation in the load applied from grindstones 50 to semiconductor wafer 10 is reduced. In particular, if surface 33 of sealer 32 is substantially coplanar with obverse face 23 of each of second semiconductor chips 22 in the top tier, variation in the load of grindstones 50 can be made smaller. As a result, damage to a part of each of semiconductor chips 12 or 22 (a chip crack) and variation in the thickness of semiconductor wafer 10 after grinding can be prevented.

Figure 4A:
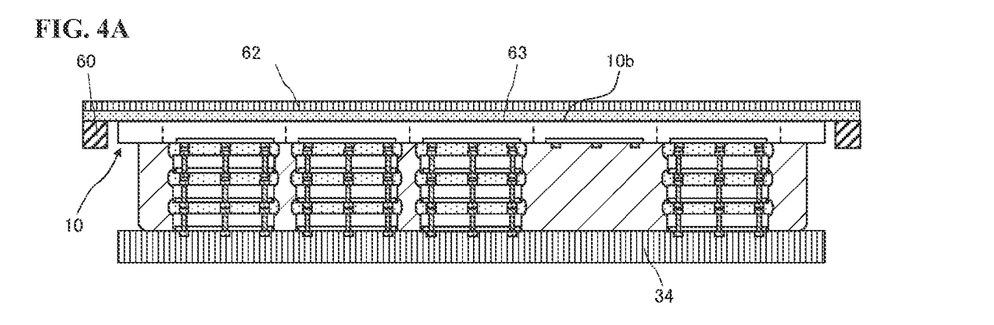
FIGS. 4A to 4D are process views showing, in a stepwise manner, a process subsequent to FIG. 1E.
Figure 4B:
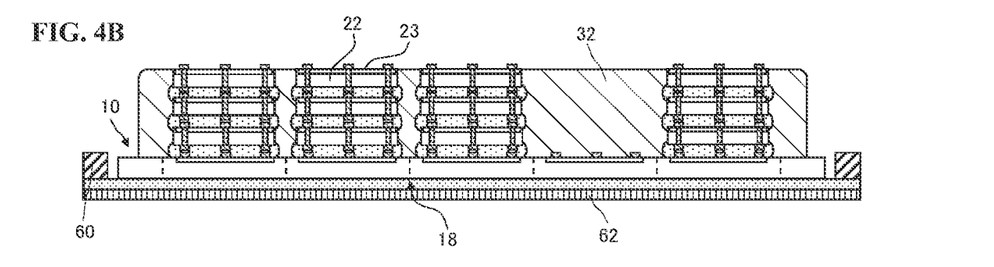

Dicing tape 62 which is attached across ring-like jig 60, as shown in FIG. 4A, is attached to reverse face 10b of semiconductor wafer 10 that has undergone the back-grinding process via adhesive layer 63. After that, as shown in FIG. 4B, protective tape 34 is removed to expose obverse face 23 of each of second semiconductor chips 22 in the top tier mounted on semiconductor wafer 10.

Figure 4C:
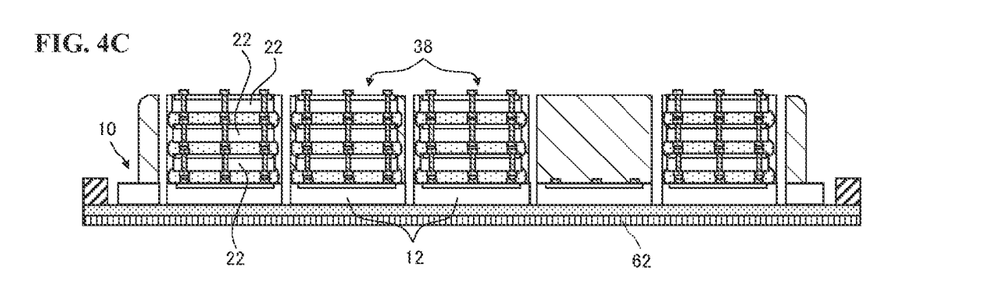
Figure 4D:
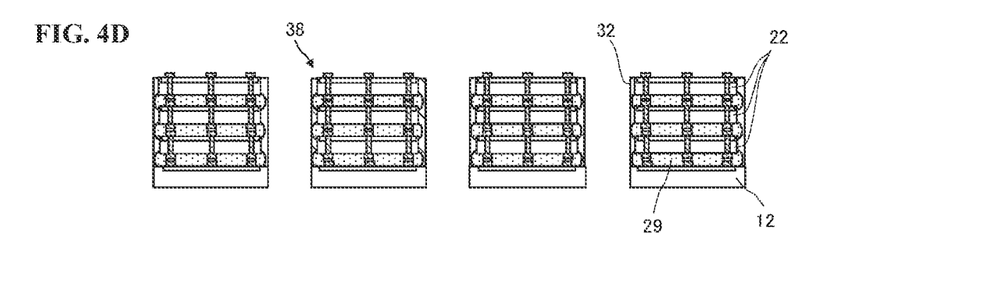

As shown in FIG. 4C, semiconductor wafer 10 and sealer 32 are cut along dicing lines 18 formed in semiconductor wafer 10 by a dicing apparatus (not shown). With this operation, semiconductor wafer 10 is divided such that first semiconductor chips 12 are separate from one another. As a result, chip stacks 38 which are each composed of first semiconductor chip 12 and three second semiconductor chips 22 stacked on top of one another are obtained. Next, as shown in FIG. 4D, chip stacks 38 are picked up from dicing cape 62.

As described above, second semiconductor chips 22 are provided on semiconductor wafer 10 including the plurality of first semiconductor chips 12, and semiconductor wafer 10 is then cut such that first semiconductor chips 12 are separate from one another. With these operations, a plurality of chip stacks 38 can be collectively formed. This improves the manufacturing efficiency of chip stacks 38 and allows a reduction in the cost of manufacturing chip stacks 38. Additionally, second semiconductor chip 22 is not mounted on defective in semiconductor chip 13, which has the advantage of preventing waste of second semiconductor chips 22.

FIGS. 5A to 5D and 6A to 6D show, in a stepwise manner, the assembly flow of a CoC semiconductor device. Wiring board 70 is first prepared (see FIG. 5A). Wiring board 70 is partitioned into portions to serve as semiconductor devices by dicing lines 76. Wiring board 70 has insulating base 71, wiring patterns which are formed on two faces of insulating base 71, and insulating films 72 and 73 which cover the wiring patterns. Parts of the wiring patterns are exposed from insulating films 72 and 73. Insulating base 71 may be a glass epoxy base. Insulating films 72 and 73 may be, for example, solder resists.

Figure 5A:
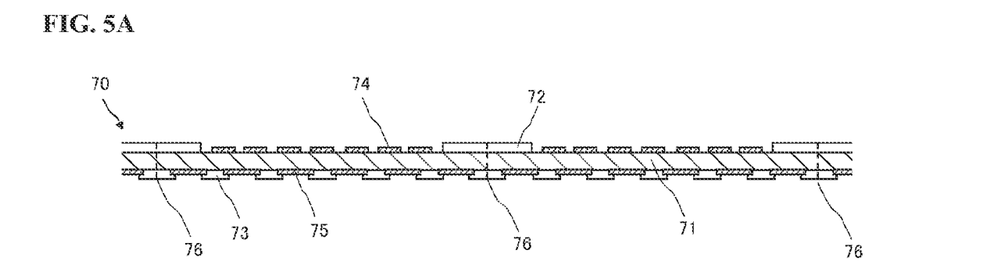
FIGS. 5A to 5D are process views showing, in a stepwise manner, a process subsequent to FIG. 4D.

The parts exposed from insulating films 72 and 73 of the wiring patterns each constitute connection pad 74 or land 75. Connection pads 74 are formed on one face of wiring board 70. Lands 75 are formed on the other face of wiring board 70. Each connection pad 74 is electrically connected to corresponding land 75 by the wiring patterns.

Figure 5B:
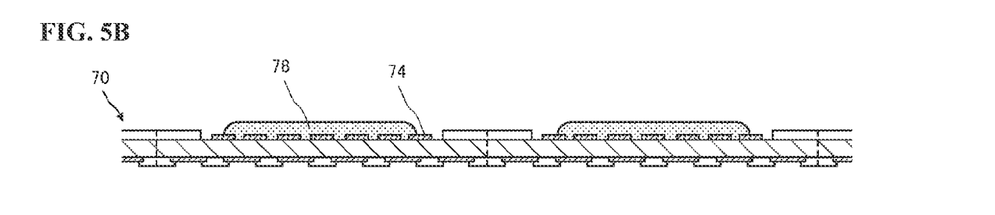

Non-conductive adhesive member (NCP) 78 is applied to areas where connection pads 74 are formed of wiring board 70 (see FIG. 5B). Third semiconductor chips 82 are then mounted on wiring board 70 (see FIG. 5C).

Figure 5C:
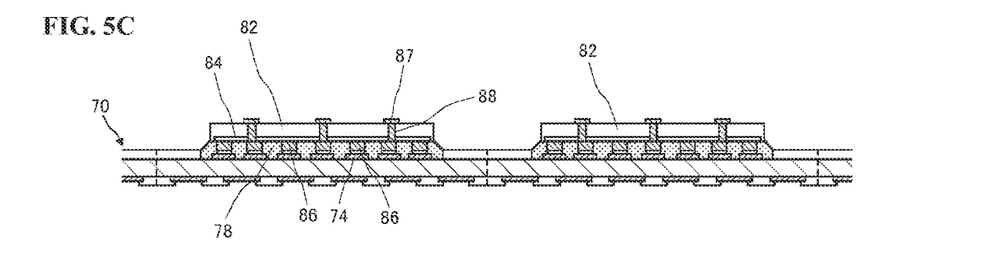

Third semiconductor chip 82 has a substrate which is made of, for example, silicon. Predetermined circuitry layer 84 is formed on one face of each third semiconductor chip 82. Most of circuitry layer 84 is covered with an insulating layer (not shown), and a part of circuitry layer 84 shat is not covered by the insulating layer is exposed. The exposed part of circuitry layer 84 that is not covered by the insulating layer forms electrode pads. Bump electrode 86 is formed on each electrode pad. Predetermined circuitry layer 84 and bump electrodes 86 are provided on the one face of third semiconductor chip 82. Bump electrodes 87 are provided on the other face on the opposite side from the one face of third semiconductor chip 82. Bump electrodes 86 on the one face of third semiconductor chip 82 and bump electrodes 87 on the other face of third semiconductor chip 82 are electrically connected by pieces 88 of through wiring which extend through the substrate.

Each bump electrode 86 on the one face of third semiconductor chip 82 is formed so that it is aligned with connection pad 74 of wiring board 70. Each bump electrode 87 on the other face of third semiconductor chip 82 is formed so that it is aligned with bump electrode 26 of second semiconductor chip 22 in the top tier of chip stack 38.

Third semiconductor chip 82 may be an interface (IF) chip, a logic chip, or a silicon interposer chip. If third semiconductor chip 82 is an IF chip, the IF chip has an interface circuit as circuitry layer 84. The IF chip is smaller than wiring board 70. In the IF chip, the spacing between bump electrodes 86 formed on the face that faces wiring board 70 is less than that between bump electrodes 87 formed on the other face.

Third semiconductor chips 82 are flip-chip mounted on wiring board 70. At this time, bump electrodes 86 on the one face of each third semiconductor chip 82 are electrically connected to connection pads 74 of wiring board 70. The joining of bump electrodes 86 and connection pads 74 can be performed through a thermocompression bonding method, an ultrasonic compression bonding method or an ultrasonic thermocompression bonding method. The gap between each third semiconductor chip 82 and wiring board 70 is filled with NCP 78.

Figure 5D:
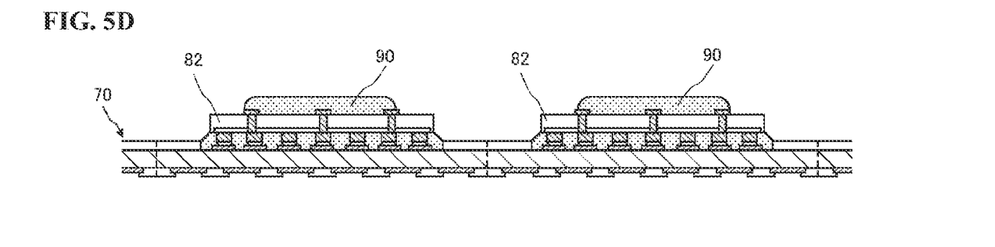

Non-conductive adhesive member (NCP) 90 is applied onto each third semiconductor chip 82 (see FIG. 5D). Chip stack 38 described above is provided on third semiconductor chip 82 (see FIG. 6A). At this time, bump electrodes 26 of second semiconductor chip 22 in the top tier of chip stack 38 and bump electrodes 87 of third semiconductor chip 82 are joined. The joining of bump electrodes 26 and 87 can be performed using a thermocompression bonding method, an ultrasonic compression bonding method, or an ultrasonic thermocompression bonding method. A space between third semiconductor chip 82 and chip stack 38 is filled with NCP 90 applied onto third semiconductor chip 82. In the above-described manner, third semiconductor chip 82 and chip stack 38 are adhesively connected.

Figure 6A:
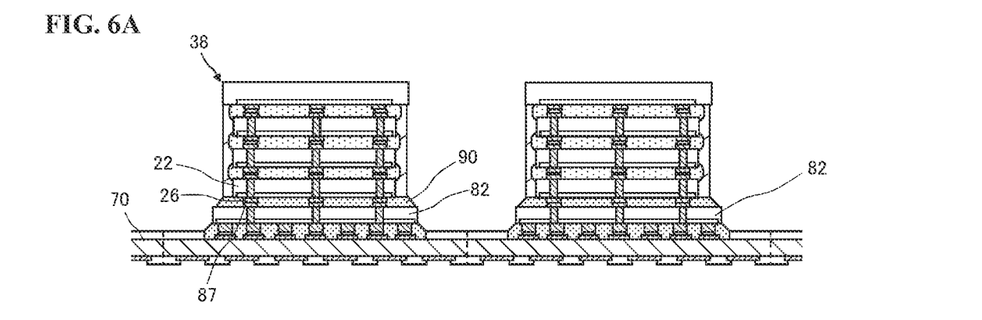
FIGS. 6A to 6D are process views showing, in a stepwise manner, a process subsequent to FIG. 5D.
Figure 6B:
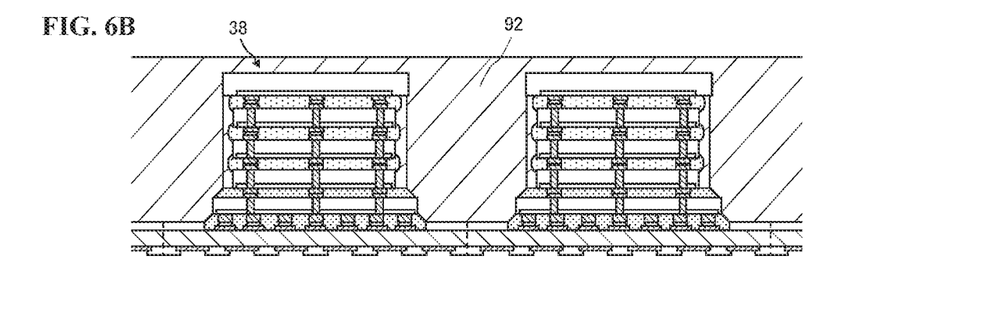
Figure 6C:
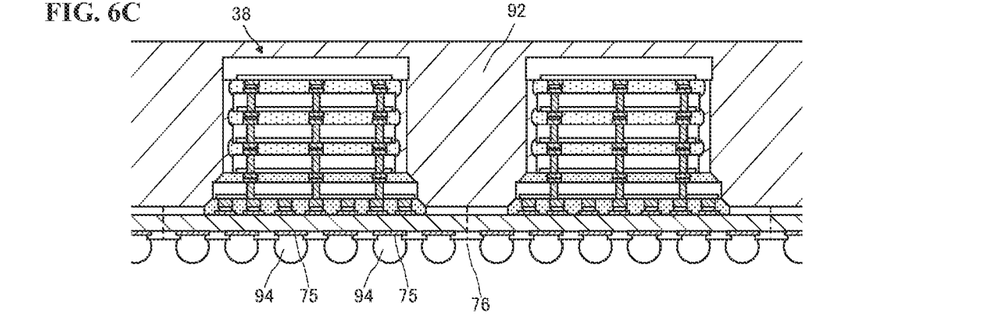

As shown in FIG. 6B, second sealer 92 is formed on wiring board 70 on which chip stacks 38 are mounted. More specifically, wiring board 70 is set in the mold die of a transfer molding apparatus (not shown), and heated and melt sealing resin is injected into a cavity in the mold die. The sealing resin is formed so as to cover the whole of each chin stack 38. As second sealer 92, a thermosetting resin, such as epoxy resin, can be used. Second sealer 92 is then cured at a predetermined temperature of, for example, about 180° C. With this curing, second sealer 92 is thermally hardened. Second sealer 92 is completely hardened by being baked at a predetermined temperature.

The assembly flow then shifts to a ball, mounting process. In the ball mounting process, conductive metal terminal 94 (e.g., a solder ball) that serves as an external terminal of a semiconductor device is connected cc each of lands 75 of wiring board 70 (see FIG. 6C).

Figure 6D:
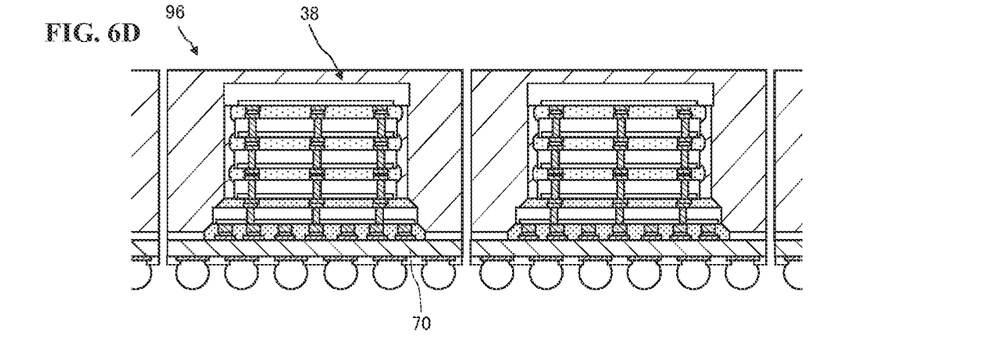

The assembly flow shifts to a substrate dicing process. In the substrate dicing process, as shown in FIG. 6D, wiring board 70 and second sealer 92 are cut along dicing lines 76 formed in wiring board 70. More specifically, in the substrate dicing process, wiring board 70 and second sealer 92 are cut by a dicing blade while a dicing tape is attached to the surface of second sealer 92. After the cutting of wiring board 70, individual semiconductor devices are picked up from the dicing tape. With this operation, a plurality of semiconductor devices 96 including chip stack 38 and wiring board 70 can be obtained.

Figure 7A:
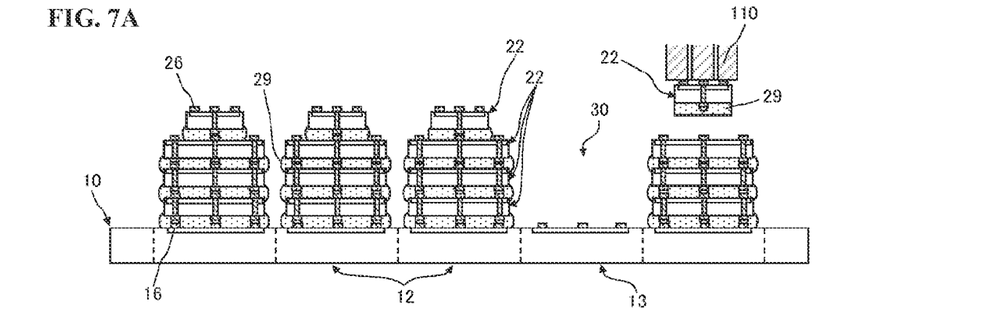
FIGS. 7A to 7D are process views showing, in a stepwise manner, a method of manufacturing a semiconductor device according to a second embodiment.

FIGS. 7A to 7D show a method of manufacturing a semiconductor device according to a second embodiment. As shown in FIG. 7A, semiconductor wafer 10 which is partitioned into a plurality of first semiconductor chips 12 is first prepared. Semiconductor wafer 10 is the same as that described in the first embodiment. Second semiconductor chits 22 that are mounted on first semiconductor chips 12 are also prepared. Second semiconductor chip 22 may also have the same configuration as that described in the first embodiment.

In the present embodiment, one in the top tier of second semiconductor chips 22 constituting a chip stack is an IF chip while the other second semiconductor chips 22 and first semiconductor chip 12 are memory chips. Second semiconductor chip 22 in the top tier here is smaller than the other second semiconductor chips 22.

As shown in FIG. 7A, second semiconductor chips 22 are provided on some of the plurality of first semiconductor chips 12. Second semiconductor chips 22 in four tiers are provided on each of first semiconductor chips 12 except for defective first semiconductor chip 13 here.

Second semiconductor chip 22 is not provided on defective first semiconductor chip 13. Thus, large void 30 is created on defective first semiconductor chip 13.

Figure 7B:
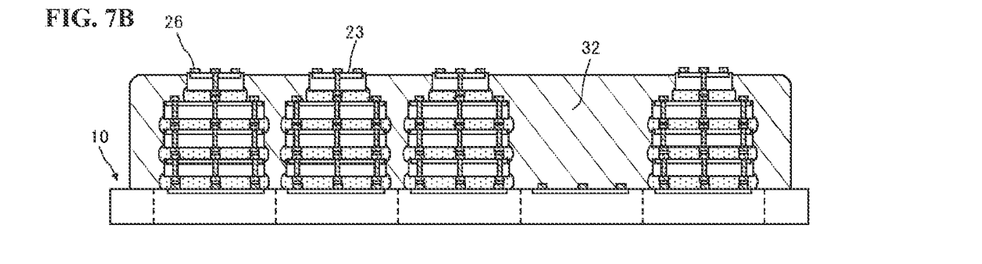

As shown in FIG. 7B, sealer 32 is provided on defective first semiconductor chip 13, and void 30 is filled with sealer 32. Sealer 32 is formed by using the same method as that in the first embodiment. The obverse face of each of second semiconductor chips 22 in the top tier and bump electrodes 26 on the obverse face are not covered by sealer 32 and thus are exposed. Although sealer 32 is formed around second semiconductor chips 22 in the to tier, obverse face 23 of each of these second semiconductor chips 22 is not covered by sealer 32 and thus is exposed.

Figure 7C:
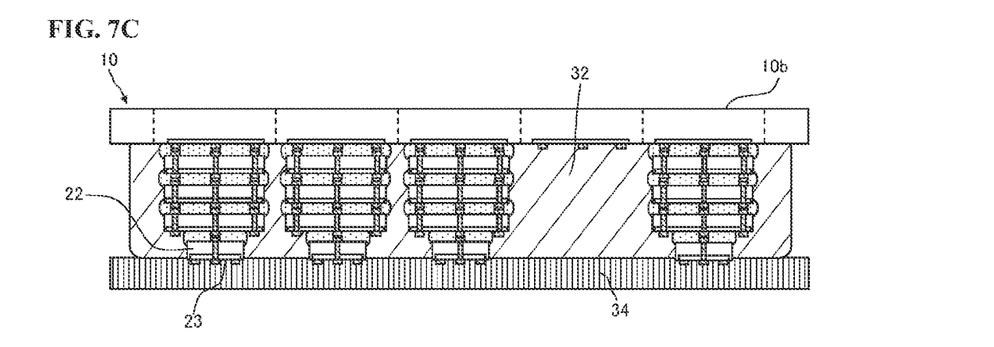
Figure 7D:
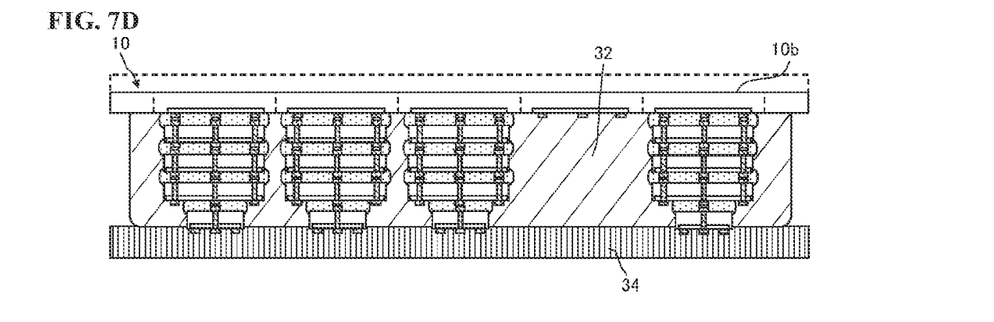

As in the first embodiment, protective tape 34 is attached to obverse face 23 of each of second semiconductor chip 22 in the top tier (see FIG. 7C). Next, as shown in FIG. 7D, semiconductor wafer 10 is thinned to a predetermined thickness by grinding reverse face 10b of semiconductor wafer 10.

In the present embodiment as well, sealer 32 fills a portion (void portion) on semiconductor wafer 10 where second semiconductor chip 22 is not mounted. Since the reverse face of semiconductor wafer 10 is ground while the void portion is filled with sealer 32, variation in the load on semiconductor wafer 10 is reduced.

Additionally, even if the plurality of second semiconductor chips 22 mounted on from semiconductor chips 12 are different in size from one another, sealer 32 seals the surroundings of the plurality of second semiconductor chips 22, which causes a narrow gap between second semiconductor chips 22 to be filled with sealer 32. As a result, the variation in the load at the time of the grinding of semiconductor wafer 10 can be made smaller.

Figure 8A:
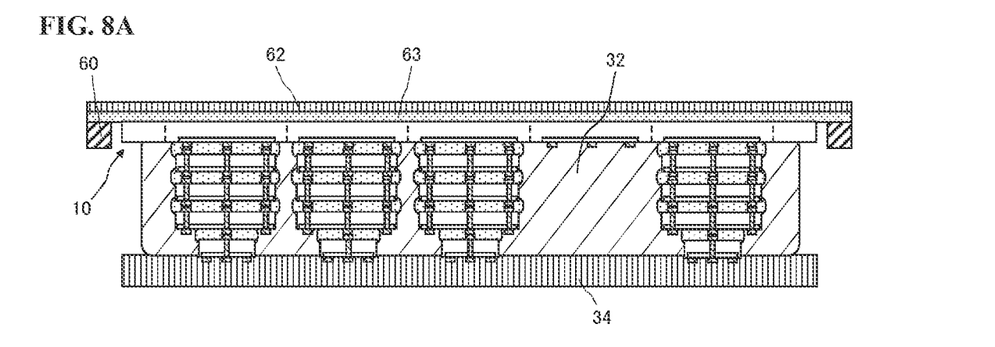
FIGS. 8A to 8D are process views showing, in a stepwise manner, a process subsequent to FIG. 7D.
Figure 8B:
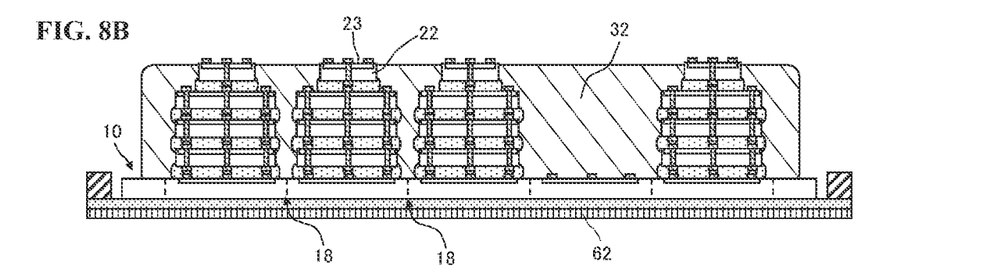

Dicing tape 62 which is attached across ring-like jig 60, as shown in FIG. 8A, is attached to reverse face 10b of semiconductor wafer 10 having undergone a back-grinding process via adhesive layer 63. Then, as shown in FIG. 8B, protective tape 34 is removed to expose obverse face 23 of each of second semiconductor chips 22 in the top tier mounted on semiconductor wafer 10.

Figure 8C:
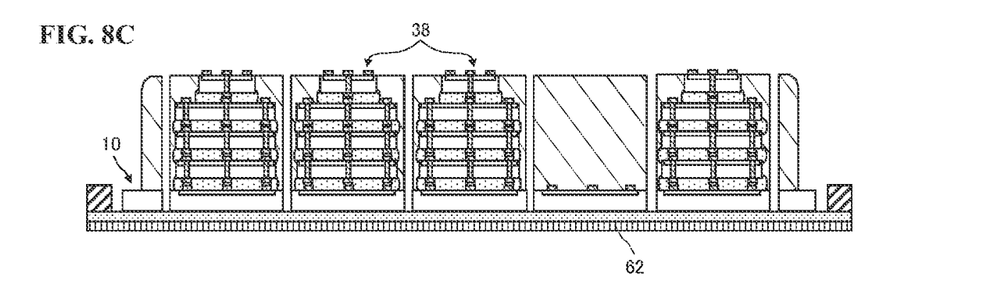
Figure 8D:
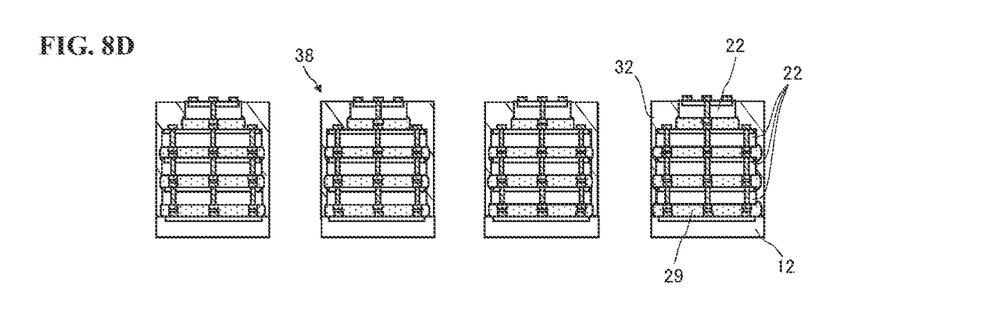

As shown in FIG. 8C, semiconductor wafer 10 and sealer 32 are cut along dicing lines 18 formed in semiconductor wafer 10. With this operation, semiconductor wafer 10 is divided such that first semiconductor chips 12 are separate from one another. As a result, chip stacks 38 which are each composed of first semiconductor chip 12 and four second semiconductor chips 22 stacked on top of one another is obtained. Next, as shown in FIG. 8D, chip stacks 38 are picked up from dicing tape 62.

FIGS. 9A to 9D show an assembly flow of a CoC semiconductor device according to the second embodiment. Wiring board 70 is first prepared (see FIG. 9A). Wiring board 70 may be the same as that in the first embodiment (see also FIG. 5A).

Non-conductive adhesive member (NCP) 78 is applied to areas where connection pads 74 are formed of wiring board 70. Chip stacks 38 described above are then provided on wiring board 70 (see FIG. 9A). At this time, bump electrodes 26 of second semiconductor chip 22 in the top tier of each chip stack 38 are joined to connection pads 74 of wiring board 70. More specifically, stud bump 79 is formed on each connection pad 74 of wiring board 70. Stud bump 79 is made of, for example, Au or Cu. Stud bump 79 is formed by performing ultrasonic thermocompression bonding of a melt wire with a ball formed at the distal end to connection pad 74 and then by pulling and breaking the rear end of the wire by a wire bonding apparatus (not shown). Stud bump 79 is preferably formed to be convex on connection pad 74. After stud bumps 79 are formed, bump electrodes 26 of each second semiconductor chip 22 in the top tier are joined to connection pads 74 via stud bumps 79. Note that the space between wiring board 70 and chip stack 38 is filled with NCP 78 applied to wiring board 70.

Figure 9A:
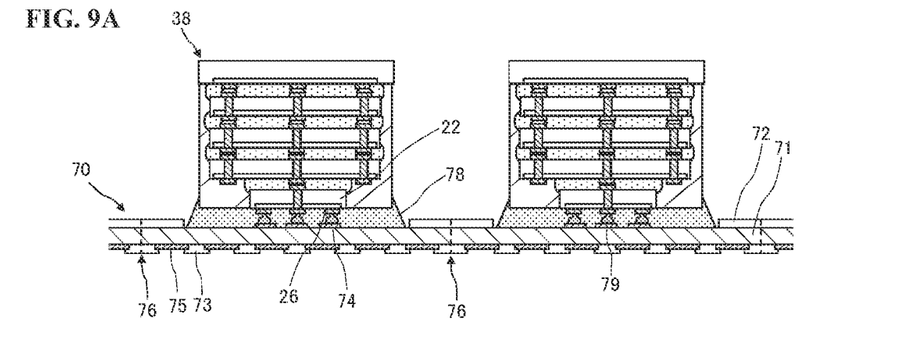
FIGS. 9A to 9D are process views showing, in a stepwise manner, a process subsequent to FIG. 8D.
Figure 9B:
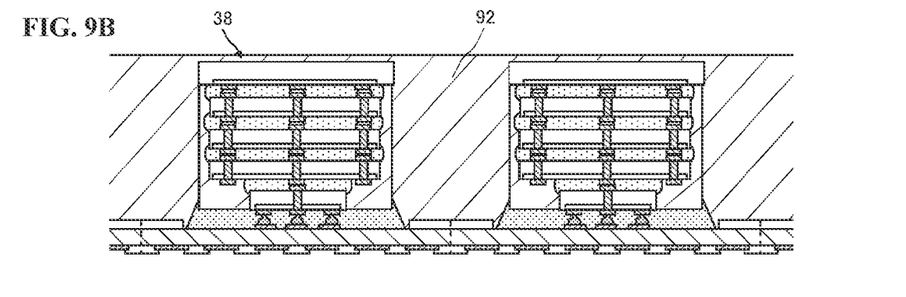
Figure 9C:
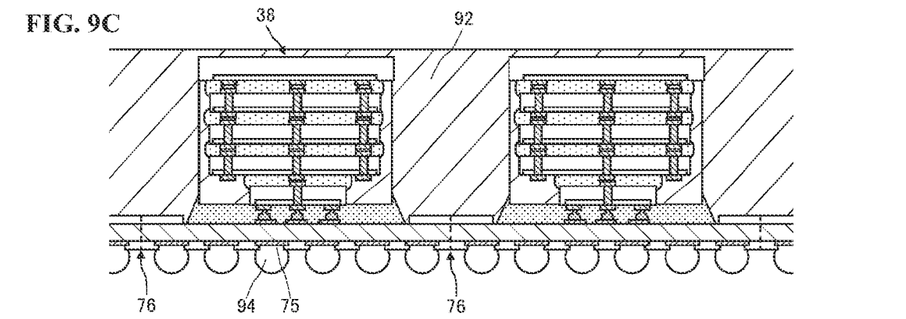
Figure 9D:
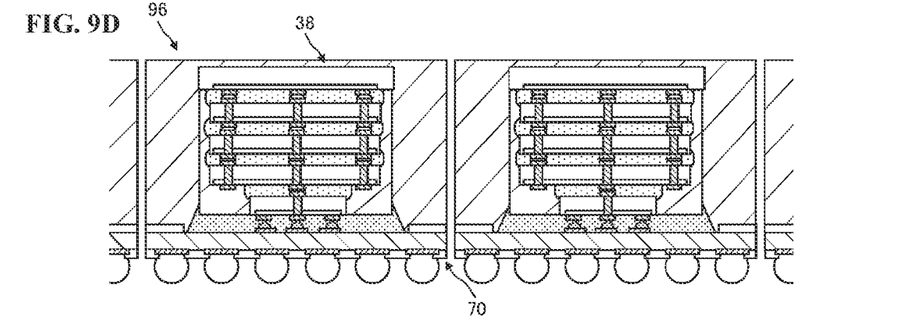

As shown in FIG. 9B, second sealer 92 is formed on wiring board 70 with chip stacks 38 mounted thereon. Second sealer 92 can be formed by the same method as that in the first embodiment. The assembly flow shifts to a ball mounting process. In the ball mounting process, conductive metal terminal 94 that serves as an external terminal of a semiconductor device is connected to each land 75 of wiring board 70 (see FIG. 9C). The assembly flow shifts to a substrate dicing process. In the substrate dicing process, as shown in FIG. 9D, wiring board 70 and second sealer 92 are cut along dicing lines 76 formed in wiring board 70. With this operation, a plurality of semiconductor devices 96 including chip stack 38 and wiring board 70 can be obtained.

The invention made by the present inventor has been described above in the context of specific embodiments. The present invention, however, is not limited to the above-described embodiments, and various changes can, of course, be made without departing from the scope thereof.

The above-described embodiments each have illustrated a mode in which second semiconductor chips 22 in three or four tiers are mounted on semiconductor wafer 10. The present invention is not limited to this, and a semiconductor chip (semiconductor chips) in one tier, two tiers, or five or more tiers may be mounted on each first semiconductor chip 12 of semiconductor wafer 10. Second semiconductor chip 22 that is mounted on first semiconductor chip 12 is not limited to a memory chip or an interface chip and may be a chip having an arbitrary circuitry layer. As described above, the number and type of semiconductor chips constituting chip stack 38 can be appropriately selected according to purpose, function, and the like. The plurality of semiconductor chips 22 may be different in size from one another.

In the example shown in FIGS. 1A to 1E and 2A to 2C, first semiconductor chip 12 has bump electrodes only on one face and does not have a piece of through wiring. First semiconductor chip 12, however, may have bump electrodes on two faces. In this case, semiconductor chip 12 may have through electrodes which electrically connect bump electrodes on the two faces.

In addition, in the above-described embodiments, defective first semiconductor chip 13 is detected in advance from among the plurality of first semiconductor chips 12 in semiconductor wafer 10, and second semiconductor chips 22 are mounted on first semiconductor chips 12 except for defective first semiconductor chip 13. Even when there is no defective first semiconductor chip 13, if second semiconductor chips 22 are mounted on only some of the plurality of first semiconductor chips 12, a large void is created on first semiconductor chip 12 with no second semiconductor chips 22 provided thereon. In this case, variation in the load on semiconductor wafer 10 in the back-grinding process of grinding the reverse face of semiconductor wafer 10 can be reduced by filling the void with sealer 32 before the back-grinding process is carried out.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device, the method comprising:
preparing a semiconductor wafer which is partitioned into a plurality of first semiconductor chips, the plurality of first semiconductor chips including a first group of first semiconductor chips and a second group of defective semiconductor chips;

positioning a plurality of second semiconductor chips over corresponding ones of the first semiconductor chips of the first group, but not over the defective semiconductor chips such that individual ones of the second semiconductor chips are separated from one another by individual voids over each of the defective semiconductor chips;

disposing a sealer on a face of each of the defective semiconductor chips and such that the sealer fills the individual voids over each of the defective semiconductor chips; and grinding a face of the semiconductor wafer after the voids over each of the defective semiconductor chips are filled with the sealer, thereby reducing a variation in load applied to the semiconductor wafer during grinding.

2. The method of manufacturing a semiconductor device according to claim 1, the method further comprising detecting the defective semiconductor chips from among the plurality of first semiconductor chips.

3. The method of manufacturing a semiconductor device according to claim 1, wherein a third bump electrode is provided on one face of the second semiconductor chips, the one face being on the opposite side from the first semiconductor chips, and the sealer is provided so as to expose the third bump electrode.

4. The method of manufacturing a semiconductor device according to claim 3, wherein a surface of the sealer is substantially coplanar with the one surface of the second semiconductor chips.

5. The method of manufacturing a semiconductor device according to claim 1, the method further comprising cutting the semiconductor wafer such that the first semiconductor chips are separate from one another to obtain a chip stack including the first semiconductor chip and the second semiconductor chip.

6. The method of manufacturing a semiconductor device according to claim 5, the method further comprising:

mounting a plurality of the chip stacks on a wiring board; and cutting the wiring board such that areas, in each of which the chip stack is mounted, are separate from one another.

7. The method of manufacturing a semiconductor device according to claim 1, wherein the first semiconductor chip is a memory chip.

8. The method of manufacturing a semiconductor device according to claim 1, the method further comprising disposing a filler on a face of each of the first semiconductor chips of the first group before disposing the sealer on the face of each of the defective semiconductor chips.

9. A method of manufacturing a semiconductor device, the method comprising:

preparing a semiconductor wafer which is partitioned into a plurality of first semiconductor chips;

detecting a defective first semiconductor chip from among the plurality of first semiconductor chips;

positioning a plurality second semiconductor chips in at least one tier on corresponding ones of the first semiconductor chips except for the defective first semiconductor chip such that individual ones of the second semiconductor chips are separated from one another by a void over the first defective semiconductor chip;

disposing a sealer in the void and on a face of the defective first semiconductor chip; and grinding one face of the semiconductor wafer which is on the opposite side from a face in which the second semiconductor chips and the sealer are provided, wherein grinding the one face includes grinding the one face while the void over the first defective semiconductor chip is filled with the sealer to reduce a variation in load applied to the semiconductor wafer during grinding.

10. The method of manufacturing a semiconductor device according to claim 9, wherein a third bump electrode is provided on one face of one semiconductor chip in a top tier from among the semiconductor chips provided on the first semiconductor chip, the one face being on the opposite side from the first semiconductor chip, and the sealer is provided so as to expose the third bump electrode.

11. The method of manufacturing a semiconductor device according to claim 10, wherein a surface of the sealer is substantially coplanar with an upper surface of the semiconductor chip in the top tier.

12. The method of manufacturing a semiconductor device according to claim 9, the method further comprising cutting the semiconductor wafer such that the first semiconductor chips are separate from one another to obtain a chip stack including the first semiconductor chip and the second semiconductor chip.

13. A method, comprising:

preparing a semiconductor wafer including a first surface, a second surface opposite to the first surface and a plurality of first semiconductor chip regions formed in a side of the first surface;

detecting a defective chip from among the plurality of first semiconductor chips, before stacking a plurality of second semiconductor chips;

stacking the plurality of second semiconductor chips over the first semiconductor chips except for the defective chip, wherein each of the second semiconductor chips includes an upper surface;

providing a sealing layer on the first surface of the semiconductor wafer with a sheet member being in contact with the upper surfaces of the second semiconductor chips, wherein the sealing layer is provided on the first surface of the semiconductor wafer so as to directly cover the defective chip and to fill a void that extends over the defective chip and between individual ones of the second semiconductor chips; and grinding the second surface of the semiconductor wafer, after providing the sealing layer.

14. The method as claimed in claim 13, wherein each of the second semiconductor chips includes a third bump electrode on the upper surface thereof, and the third bump electrodes of the second semiconductor chips are exposed from the sealing layer.

15. The method as claimed in claim 14, further comprising:

separating the semiconductor wafer into a plurality of chip stacks, each of the chip stacks including a corresponding first semiconductor chip and a corresponding second semiconductor chip, and mounting the chip stacks over a wiring board, and the third bump electrode of the corresponding second semiconductor chip of the chip stacks being electrically coupled to the wiring board.

16. The method as claimed in claim 14, wherein each of the first semiconductor chips includes a first bump electrode thereon, each of the second semiconductor chips includes a second bump electrode on a lower surface that is opposite to the upper surface and a through electrode electrically coupled to the second and third bump electrodes, and the second semiconductor chips are stacked over the first semiconductor chips of the semiconductor wafer so that the second bump electrodes electrically couple to the first bump electrodes.

17. The method as claimed in claim 13, wherein the sealing layer includes a top surface that is substantially coplanar with the upper surfaces of the second semiconductor chips.

18. A method comprising:
providing an intermediate structure, the providing the intermediate structure comprising:
preparing a wafer comprising a plurality of first semiconductor chips that are combined laterally with one another by a dicing line area, the plurality of first semiconductor chips including a plurality of non-defective chips and at least one defective chip, the at least one defective chip being between adjacent two of the non-defective chips;
stacking a plurality of second semiconductor chips over the plurality of the non-defective chips, respectively, but not over the at least one defective chip such that a void is formed over the at least one defective chip; and
forming a sealer such that the sealer fills the void over the at least one defective chip; and
thinning the intermediate structure.

19. The method of claim 18, wherein the thinning the intermediate structure comprises grinding the intermediate structure.

20. The method of claim 18, wherein the preparing the semiconductor wafer comprises detecting the at least one defective chip from among the plurality of first semiconductor chips, and wherein stacking the plurality of second semiconductor chips is performed after the detecting.

21. A method comprising:
preparing a wafer comprising a plurality of first semiconductor chips that are combined laterally with one another by a dicing line area, wherein each of the plurality of first semiconductor chips is to be shipped if defectiveness is not detected therein;
detecting whether each of the plurality of first semiconductor chips is non-defective or defective so that the wafer is modified such that the plurality of first semiconductor chips includes a plurality of non-defective chips and at least one defective chip;

stacking a plurality of second semiconductor chips over the plurality of non-defective chips, respectively, but not over the at least one defective chip such that a void is formed over the at least one defective chip;
forming a sealer such that the sealer fills the void over the at least one defective chip; and
thinning the wafer after the void is filled with the sealer.

22. The method of claim 21, wherein the thinning the wafer is performed by grinding.

23. The method of claim 21, wherein the at least one defective chip is sandwiched between at least two of the plurality of non-defective chips adjacent to each other.

24. The method of claim 21, wherein the void over the at least one defective chip is sandwiched between adjacent two of the plurality of second semiconductor chips that are stacked respectively over adjacent two of the plurality of non-defective chips that sandwich the at least one defective chips therebetween.

25. A method comprising:
preparing a wafer, the wafer comprising a plurality of first semiconductor chips that are combined laterally with one another by a dicing line area, the plurality of first semiconductor chips including at least one defective chip and a plurality of non-defective chips, the at least one defective chip and the plurality of non-defective chips being equal in size to one another;
stacking a plurality of second semiconductor chips over the plurality of non-defective chips, respectively, but not over the at least one defective chip such that a void is formed over the at least one defective chip;
forming a sealer such that the sealer fills the void over the at least the defective chips; and
grinding the wafer.

26. The method of claim 25, wherein the grinding the wafer is performed after the void is filled with the sealer.

27. The method of claim 25, wherein the void over the at least one defective chip is sandwiched between adjacent two of the plurality of second semiconductor chips that are stacked respectively over adjacent two of the plurality of non-defective chips that sandwich the at least one defective chips there between.

28. The method of claim 25, wherein the preparing the wafer comprises detecting the at least one defective chip among the plurality of first semiconductor chips before stacking the plurality of second semiconductor chips.

* * * * *